United States Patent [19]

Erwin

[11] Patent Number: 4,578,751

[45] Date of Patent: Mar. 25, 1986

[54] SYSTEM FOR SIMULTANEOUSLY PROGRAMMING A NUMBER OF EPROMS

[75] Inventor: Edward A. Erwin, Mesquite, Tex.

[73] Assignee: AT&T Technologies, Inc., Berkeley Heights, N.J.

[21] Appl. No.: 392,053

[22] Filed: Jun. 25, 1982

[51] Int. Cl.⁴ .................... G06F 9/00; G06F 13/00
[52] U.S. Cl. ................................ 364/200; 364/300; 371/21; 365/94; 365/96; 365/218
[58] Field of Search ... 364/200 MS File, 900 MS File, 364/300; 365/94, 96, 22, 218, 104, 185; 371/10, 20, 21

[56] References Cited

U.S. PATENT DOCUMENTS

| | | | |
|---|---|---|---|
| 3,969,618 | 7/1976 | Strubel et al. | 371/20 |
| 4,093,998 | 6/1978 | Miller | 364/900 |
| 4,106,105 | 8/1978 | Pross, Jr. | 364/900 |
| 4,238,839 | 12/1980 | Redfern et al. | 365/96 |
| 4,244,032 | 1/1981 | Oliver | 364/900 |
| 4,377,857 | 3/1983 | Tickle | 365/185 |
| 4,382,279 | 5/1983 | Ugon | 364/200 |
| 4,441,164 | 4/1984 | Pavan et al. | 364/900 |
| 4,443,185 | 4/1984 | Schultz et al. | 364/900 |
| 4,460,982 | 7/1984 | Gee et al. | 365/189 |
| 4,498,151 | 2/1985 | Henry | 364/900 |
| 4,545,038 | 10/1985 | Bellay et al. | 365/230 |

OTHER PUBLICATIONS

R. Coates, *Nanocomp E.P.R.O.M. Programmer*, Wireless World (Jan. 1982, vol. 88, No. 1552) pp. 30–33.
J. MacDougall, *Powered Down Bipolar PROMs*, Interface Age (Apr. 1980) pp. 108–112.
T. Hayek, *Simple and Low-Cost PROM Programmer*, Kilobaud (Jul. 1978) pp. 94–94.
R. Glaser, *Program Those 2708s*, Byte (Apr. 1980, vol. 5, No. 4) pp. 198–210.
J. Javetski, *PROM Programmers Move From the Lab to the Assembly Line*, Microsystem Development (Jul. 1982), pp. 41–45.

Primary Examiner—James D. Thomas
Assistant Examiner—A. Williams, Jr.
Attorney, Agent, or Firm—R. P. Miller; M. de Picciotto

[57] ABSTRACT

A method and system are used for simultaneously programming a group of erasable programmable read only memories (EPROMs) (11) originally set in the "all-ones" state, by routing (17-49) programmed bytes, bit by bit, to each memory site on each EPROM and blocking (48) or bypassing the programming steps where a programmed byte consists of all ones, thus saving the programming time that would be normally used to program "all-ones" sites. Each programmed site and the sites set in the "all-ones" state are verified (52) prior to the routing of subsequent programmed bytes.

1 Claim, 4 Drawing Figures

SYSTEM FOR SIMULTANEOUSLY PROGRAMMING A NUMBER OF EPROMS

FIELD OF THE INVENTION

This invention relates to a method and a system for simultaneously programming a number of EPROMs (Erasable Programmable Read Only Memories) in an identical fashion and, more particularly, to methods for eliminating a programming operation when a memory site is already set in accordance with the data that is to be imparted to that site.

BACKGROUND OF THE INVENTION

EPROMs find a wide range of usage in the newer telephone switching systems and are usually set in a factory prior to assembly into a switching machine. Each EPROM is characterized in the ability to be erased by subjection of the memory sites to ultraviolet light which acts to erase or set all of the sites to an "all-ones" state. The programming of such a memory is accomplished by selectively switching or resetting various permutations of bit locations in each memory site to the zero condition to provide the required data storage. Heretofore, the programming of the memory sites has been generally attained by programming the EPROMs on an individual basis, that is, each EPROM is separately programmed in accordance with data received from a single program source.

In programming EPROMs, situations often arise where the byte to be programmed at a memory site consists of "all-ones" data. Significant time is consumed in routing and impressing each bit into a memory location, and manifestly it is a wasteful operation to route an "all-ones" byte into a site that is already set in an "all-ones" condition. This situation is quite common because the source program data comprises many bytes of "all-ones" which may be indicative of intelligent (real) data, a space, or, one or more sites to be reserved for future programming. It is believed apparent that it is desirable to have a system which is capable of simultaneously programming a number of EPROMs together with facilities for avoiding the programming of bytes of "all-ones" where the intended memory sites are already in an "all-ones" condition.

SUMMARY OF THE INVENTION

This invention comtemplates, among other things, a method and system for simultaneously applying from a single program source, programmed bytes of intelligence to a number of erasable read only memories in which the memory sites are preset in an "all-ones" condition, together with facilities for blocking the program setting operation when a byte to be set in memory consists of bits of all ones.

More particularly, a system for programming a number of EPROMs all at the same time is provided in which all of the EPROMs are initially erased by subjecting the memory sites to ultraviolet light which is effective to erase and set all of the memory sites to an "all-ones" state. A cabinet is provided and includes a number of connectors that are adapted to receive a number of circuit boards on which the EPROMs are mounted along with an interface circuit board that functions to route each successive data bit received from a program source to identical corresponding bit locations in the respective EPROMs. The cabinet may also include a connector for receiving a master circuit board having an identical array of EPROMs that have been set in accordance with the data that is to be set into the EPROMs on the other boards.

In practicing the method of the invention, a central computer is programmed to read and store, through the agency of the interface, the program set in the EPROMs of the master board. During the subsequent execution of the simultaneous programming operations, each successive data bit is read from the computer storage and routed by the interface circuit to the corresponding bit locations in each of the EPROMs. The computer is programmed to analyze each byte called from storage and is effective to block or bypass the routing of those bytes consisting of all ones.

Following the setting of each byte site in each EPROM, the computer, in conjunction with the interface is instructed and operated to read the programmed site and route the read data back to the computer for verification prior to the calling of the next byte from the computer storage. The verification step is also made for those sites that were intended to be programmed to "all-ones" state but for which the data byte was blocked from routing to the memory site. In other words, the blocking of an "all-ones" byte does not interfere with the site verification step. Following the detection of a verification error with respect to a particular EPROM, however, the routing of data bytes to set the other EPROMs continues.

BRIEF OF THE DRAWINGS

Other advantages and features of the invention will be apparent upon consideration of the following detailed description when considered with the drawing wherein.

DETAILED DESCRIPTION

Figure 1:
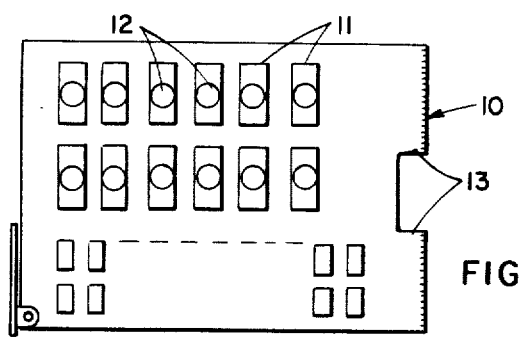
FIG. 1 is a top view of the circuit board having mounted thereon a number of EPROMs that are to be programmed in accordance with the principles of the invention.

Referring to FIG. 1, there is shown a printed circuit board or pack 10 having a plurality of EPROMs (Erasable Programmable Read Only Memories) 11 mounted thereon along with a number of other integrated circuits (ICs) and electrical components. A typical EPROM may consist of 2,048 addressable memory sites in which data bytes of 8 bits may be stored. EPROMs are constructed with quartz windows 12 through which ultraviolet light may be transmitted to erase and initially set all the memory byte sites in "all-ones" conditions. The EPROM are further characterized in that they may only be reset by electrical bit pulses that function to shift a bit from the one state to a zero state.

Figure 2:
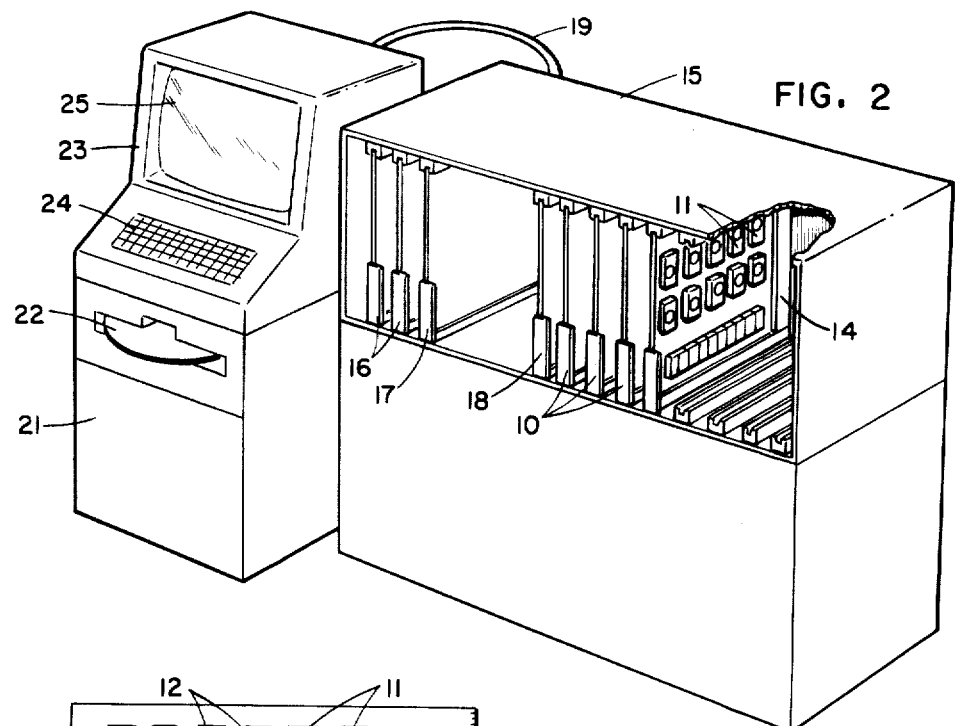
FIG. 2 is a perspective view of a hardware configuration that may be used to simultaneously program a number of EPROMs respectively located on a number of circuit boards.

The circuit board 10 includes printed circuit paths that run from the EPROMs and the other components to a series of pads or contact fingers 13 located along the right-hand end of the board. The end of the board with the contact fingers is adapted to be inserted into a socket-like connector 14 (see FIG. 2) mounted in a housing 15. The housing is constructed with a number of connectors 14 to receive not only EPROM boards but also other boards such as power supply boards 16, a CPU interface board 17 and a master program board 18, similar to board 10. The interface board is designed to route successive bytes of data signals received over a cable 19 to the respective EPROMs 11 mounted on a number of boards 10. Each byte site in each EPROM comprises a number, e.g., 8, of bit locations corresponding to the number of bits in each byte. The bit locations, upon receipt of a program data word signal, may be held in a one state or switched to a zero state. The interface board 17 is controlled by a central processing unit (CPU) 21 which may be a minicomputer such as a PDP 8, manufactured by the Digital Equipment Company. This particular minicomputer is a 12 bit machine which means that it communicates through a data channel that consists of 12 simultaneous inputs or outputs, each bit being a one or a zero. The 12 outputs are simultaneously transmitted over the cable 19 and routed by the interface board 17 to identical EPROMs located on a series of 12 EPROM packs loaded into the cabinet. The interface board, under the control of the CPU, is also effective upon command to successively read each programmed site and route the stored data back into the central processing unit 21 for anlaysis and verification.

The master program pack 18 is identical in construction to the circuit boards 10, but this pack is previously programmed or set in accordance with the data to be imparted to the EPROMs 11 on the other circuit boards 10. The interface 17, upon command from the CPU 21, reads the data setting of the memory sites on the master programmed board 18 and impresses the stored data on the program source 22, which may be in the form of a disc memory. The system also includes a data terminal 23 with a keyboard 24 and a visual display 25 that is operative to introduce control signals into the CPU to initially set the overall control program in the CPU. The terminal is also utilized to provide visual indication of various conditions in the system such as indication that the EPROM boards are properly seated in the connectors 14 or that one of the connectors does not have a board 10 installed therein. Terminal 23 is also capable of providing a display of the data setting of each memory site.

Figure 3:
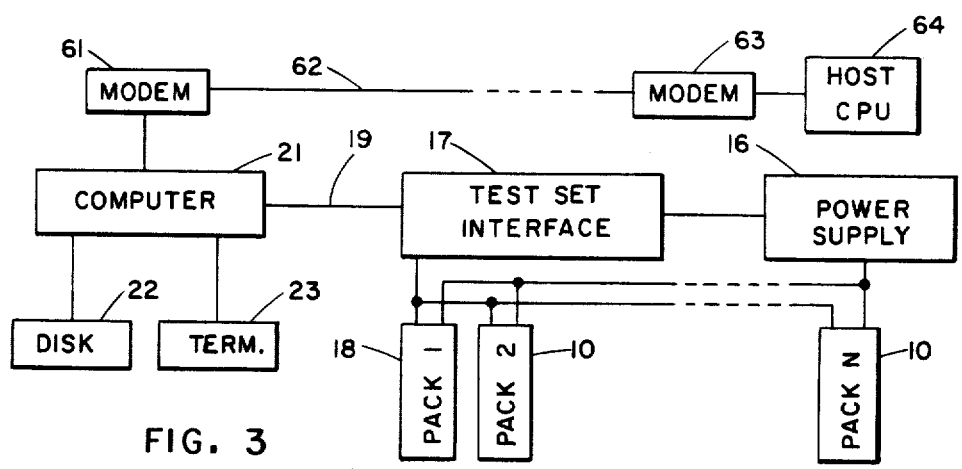
FIG. 3 is a schematic block diagram showing the data path interrelationship between the hardware units shown in FIG. 2.

A further understanding of the method of simultaneously programming a group of 12 EPROMs circuit packs 10 may be enhanced by reference to the data transmission and control diagram shown in FIG. 3. The circuit packs 10 are initially erased by exposure to ultraviolet light, which functions to set all the bit memory locations in the one (1) state. Twelve circuit packs are inserted in the connectors 14. In the normal programming operation each data byte is routed over 12 wires in the cable 19 through the interface, bit by bit, to corresponding memory locations in 12 EPROMs mounted on the individual circuit packs. Zero data bits are effective to reset the memory locations to the zero state while one (1) data bits do not disturb the original memory setting.

Assume that the data stored in the program source 22 is in accordance with the data set in the master circuit pack 18 and the programming cycle is commenced, the programmed data bytes are successively routed as control signals to set each data site in each corresponding EPROM on each of the circuit packs. Normally, about 50 milliseconds is consumed to simultaneously program or set the byte sites on the 12 corresponding memories. Even if only one circuit pack 10 is being programmed, it will take about 50 milliseconds to program and set each memory site. The stream of data signals used to program the memory includes a number of data bytes of "all-ones" (1's) which may be indicative of intelligent (real) data, a space, or a site to be reserved for future programming. When setting or programming a number of EPROMs on each circuit pack a significant amount of time is spent in programming sites already set in an "all-one" state with data bytes of "all-ones". In order to avoid such wasteful operation, the present invention provides methods and facilities for aborting the programming of a memory site which is already set in accordance with data specified to be inserted to that site. The method contemplates verifying the data setting of each site even though the data byte specified for that location was not applied to the site because it consisted of all one bits.

Figure 4:
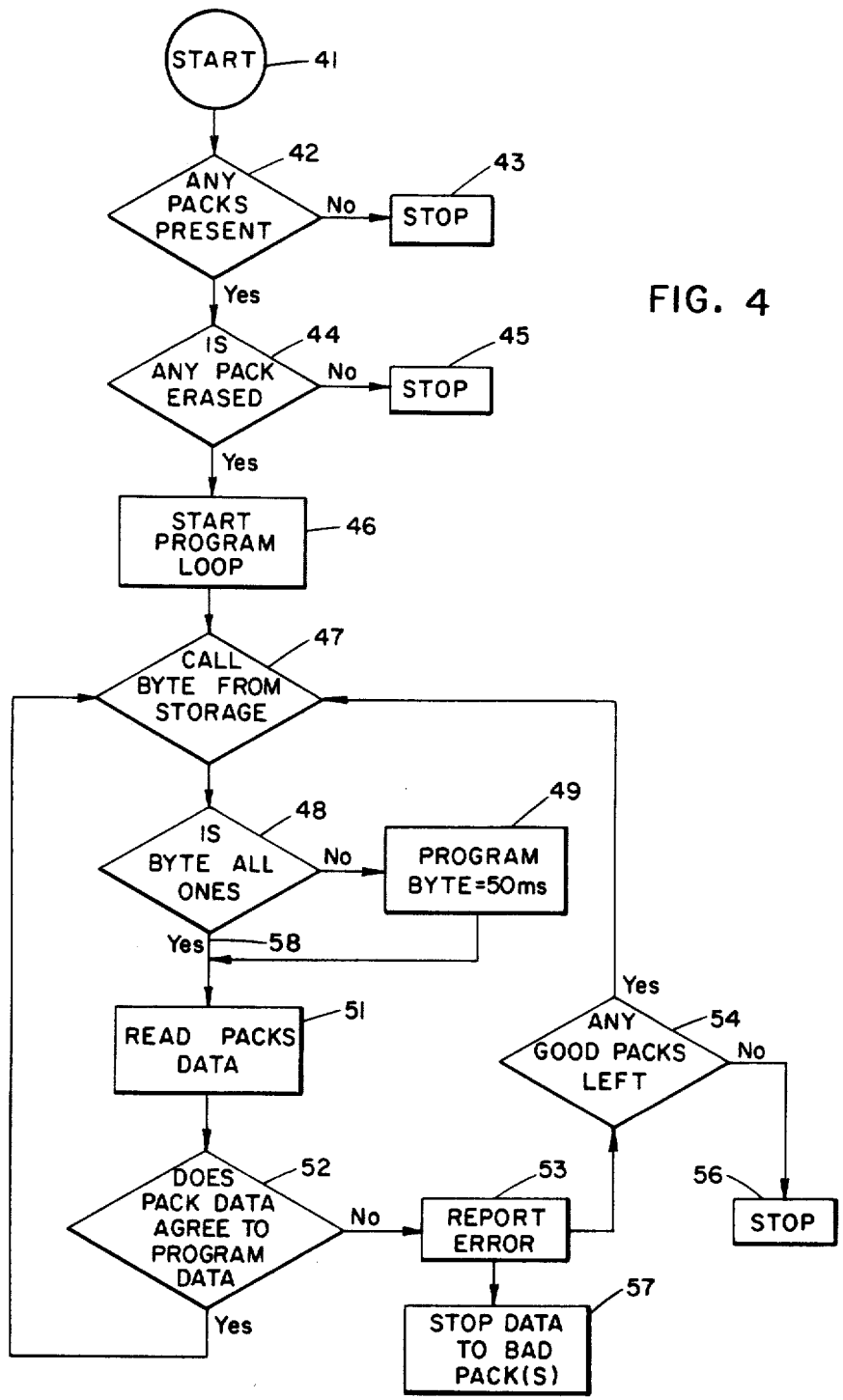
FIG. 4 is a flow chart of a series of programmed method steps to be followed for simultaneously programming a number of EPROMs with the hardware shown in the other FIGURES.

More particularly, refer to FIG. 4, which is a flow chart indicating the manner in which the minicomputer associated with the apparatus shown in the other view is programmed and functions to control the selective programming of memory sites in a number of groups of EPROMs mounted on individual circuit boards. The system is controlled by the minicomputer 21 which is programmed to function in accordance with the flow chart. The interface 17 provides the data link between the CPU 21 and the individual circuit packs 10. This interface ensures that each data bit is routed simultaneously to memory locations in EPROMs mounted on the twelve packs 10.

At the start 41 of the programming cycle, a determination 42 is made as to the presence of the circuit packs 10. If a pack 10 is missing or not properly connected, a visual indication is provided on the display of terminal 23. If all the packs 10 are missing, the programming is stopped 43. However, if one or more packs are present, the programming cycle may proceed. Next, each EPROM on each circuit pack is checked 44 to ensure that all the memory sites have been erased and are set in the "all-one" (1) state. If all the memories have not been erased and set in the one (1) state, the programming cycle is interruped 45 and this information is presented on the terminal display 25. Actual program setting of the EPROMs may now commence 46 and the cyclic programming loop is initiated into operation. The CPU 21 successfully calls 47 each data byte from the disc memory 22 and each bit is impressed over the twelve lines of cable 19 to the CPU interface 17 to be routed to identical address sites on twelve corresponding EPROMs mounted on the twelve circuit packs 10.

Each byte called from storage is analyzed 48 and if the byte does not consist of all ones (1s), the byte is programmed 49 into appropriate memory sites in each EPROM on each of the twelve circuit packs 10. The data bytes set into the twelve memory sites on the twelve EPROMs are read 51 and verified 52 against the programmed data 48-49 that was intended to the imparted to the EPROM memory sites. If the data programmed into an EPROM is not exactly in accordance with the data received from the CPU 21, the programming is interrupted and an error indication 53 is reported and displayed at the terminal 23. After reporting all errors 53, and the CPU 21 determines that all packs 10 have errors 54, programming is stopped 56. If, however, the verification step indicates an error, in one or more packs, but less than all the packs, the programming of those packs is stopped 57 and the programming of the other packs continues. Upon verification that the received byte has been properly programmed into the correct memory sites on the twelve packs 10, the next byte to be programmed is called from the source 22.

If the analysis 48 of a byte indicates the byte is all ones, the EPROM program operation 49 is bypassed 58 and an intermediate verification 51 of the memory sites of each pack 10 is made. Inasmuch as the program operation 49 is bypassed in the "all-ones" instance, the overall time required to program the groups of EPROMs on each board is reduced. The site that is not programmed is verified and upon verification that the data of that EPROM site is at an "all-ones" (1s) condition, the program cycle continues and the next byte to be programmed is immediately called from the program source 22.

As previously mentioned, the program source 22, which may be in the form of a disc memory, has data stored on it in accordance with a program readout of the master program pack 18. In the alternative, the minicomputer 21 (see FIG. 3) may be connected to a modem 61 which in turn is linked through a telephone network 62 to a modem 63 associated with a host computer 64. In this instance, the host computer 64 will provide the master data to be stored on the system disc memory 22.

What is claimed is:

1. A system for simultaneously programming a plurality of erasable programmable read only memory devices (EPROMs), each having a number of memory sites that are each initially set in all-ones condition, which comprises:

a central processing unit;

means for rotating a program comprising a plurality of successive bytes from a master memory device and storing said program in said central processing unit;

a cabinet rack for receiving multiple circuit boards each having several EPROMs, each having all of its memory sites set in the "all-ones" condition;

an interface circuit interposed between said cabinet rack and said central processing unit for transmitting successive bytes comprising bits of ones and zeros to set each memory site accordingly and for subsequently reading the setting of each memory site back into said central processing unit;

means within the central processing unit for transferring each byte of the program to said interface circuit for impression at successive memory sites;

means within the central processing unit for recognizing bytes of all ones and blocking the impression of said "all-ones" bytes-bits to said interface; and means within the central processing unit for receiving through said interface circuit the byte setting of each programmed memory site and for verifying said setting with respect to the byte impressed through the interface circuit to the memory site, and for verifying the "all-ones" setting of those memory sites associated with the blocked "all-ones" byte recognized in the central processing unit.

* * * * *